US005235124A

United States Patent [19]

Okamura et al.

[11] Patent Number: 5,235,124

[45] Date of Patent: Aug. 10, 1993

[54] MUSICAL ACCOMPANIMENT PLAYING APPARATUS HAVING PHONEME MEMORY FOR CHORUS VOICES

[75] Inventors: Masahiro Okamura; Masuhiro Sato; Naoto Inaba; Yoshiyuki Akiba; Toshiki Nakai, all of Tokyo, Japan

[73] Assignee: Pioneer Electronic Corporation, Tokyo, Japan

[21] Appl. No.: 869,255

[22] Filed: Apr. 15, 1992

[30] Foreign Application Priority Data

Apr. 19, 1991 [JP] Japan .......... 3-088359

[51] Int. Cl.[5] .......... G10H 7/00; G11C 7/00; H03M 7/00

[52] U.S. Cl. .......... 84/601; 84/631; 84/645; 381/51

[58] Field of Search .......... 84/600-602, 84/631, 645, 603; 381/51

[56] References Cited

U.S. PATENT DOCUMENTS

| | | | |
|---|---|---|---|
| 4,527,274 | 7/1985 | Gaynor | 381/51 |
| 4,596,032 | 6/1986 | Sakurai | 381/51 |
| 4,613,985 | 9/1986 | Hashimoto et al. | 381/51 |
| 4,731,847 | 3/1988 | Lybrook et al. | 381/51 |
| 4,771,671 | 9/1988 | Hoff, Jr. | 84/645 |
| 5,046,004 | 9/1991 | Tsumura et al. | 84/645 X |
| 5,127,303 | 7/1992 | Tsumura et al. | 84/645 X |
| 5,131,311 | 7/1992 | Murakami et al. | 84/601 X |

*Primary Examiner*—William M. Shoop, Jr.
*Assistant Examiner*—Jeffrey W. Donels
*Attorney, Agent, or Firm*—Kane, Dalsimer, Sullivan, Kurucz, Levy, Eisele and Richard

[57] ABSTRACT

A musical accompaniment playing apparatus comprises a MIDI sound source, a phoneme information memory, a playing information memory, a control means, a mixing means and a sound output means.

When a user sings a song with a musical accompaniment and a back chorus, the control means controls the MIDI sound source to output an audio signal in accordance with a phoneme information stored in the phoneme memory and a playing information stored in the playing information memory. The output audio signal is mixed with a singing voice of the user at the mixing means and output from the sound output means as a song in harmony with the back chorus.

9 Claims, 8 Drawing Sheets

| | | | |
|---|---|---|---|
| NOTE ON ON/OFF 9 8 | CHANNEL (KIND) 0 ~ 15 | NOTE NO. (MUSICAL INTERVAL) 0 ~ 127 | VELOCITY (SOUND CAPACITY) 0 ~ 127 |

MUSICAL ACCOMPANIMENT PLAYING APPARATUS HAVING PHONEME MEMORY FOR CHORUS VOICES

BACKGROUND OF THE INVENTION

This invention relates to a musical accompaniment playing apparatus called "KARAOKE", and more particularly to a musical accompaniment playing apparatus capable of reproducing a chorus voice (hereinafter referred to as a back chorus) in harmony with a singing voice of a user.

As a conventional musical accompaniment playing apparatus, one capable of reproducing a back chorus in addition to a musical accompaniment, for user's enjoyment, is known. One type of such an apparatus is adapted, as shown in FIG. 1A, to reproduce a single sound or monosyllable such as "a-" or "u-" by using a specific sound generator to produce a back chorus. Further, an apparatus of other type is adapted, as shown in FIG. 1B, to store some groups of chorus voices such as "hei hei ho-" (chorus voices in a Japanese popular song "YOSAKU") coded to a PCM (Pulse Code Modulation) code, etc. into a memory and output a desired one from the memory.

However, the apparatus of the former type can output only a single sound like "a-" or "u-", but cannot output a back chorus of successive words having significant meanings. On the other hand, the apparatus of the latter type requires a large capacity memory for storing groups of chorus voices. Such a memory is expensive. Further, in the case of the latter type apparatus, since a time length of a chorus voice stored is not variable, the chorus voice is reproduced out of harmony with a user's singing voice when the user changes a tempo of a music.

SUMMARY OF THE INVENTION

An object of this invention is to provide a musical accompaniment playing apparatus capable of reproducing a back chorus having a natural feeling as a singing voice and being in harmony with a user's singing voice even if a tempo of a music is changed.

According to one aspect of this invention, there is provided a musical accompaniment playing apparatus comprising a MIDI sound source for generating an audio signal including a musical accompaniment signal and a back chorus signal to be reproduced in harmony with the musical accompaniment signal, a phoneme information memory for storing phoneme information for setting phonemes of each musical instrument used for a musical accompaniment reproduction and phonemes of a singing voice used for a back chorus reproduction, a playing information memory for storing playing information of the audio signal generated from the MIDI sound source, control means for allowing the MIDI sound source to output the audio signal in accordance with the phoneme information and the playing information, transducer means for transforming a singing voice of a singer to an electric voice signal, mixing means for mixing the audio signal with the electric voice signal and outputting a mixed audio signal, and sound output means for outputting the mixed audio signal as a sound.

According to another aspect of this invention, there is provided a musical accompaniment playing apparatus comprising a first MIDI sound source for generating a musical accompaniment signal as a first audio signal, in accordance with MIDI standards, a second MIDI sound source for generating, in accordance with the MIDI standards, a back chorus signal to be reproduced in harmony with the musical accompaniment as a second audio signal, a first phoneme information memory for storing first phoneme information for setting phonemes of each musical instrument used for musical accompaniment reproduction, a second phoneme information memory for storing second musical information for setting phonemes of voice elements used for back chorus, a playing information memory for storing first playing information of the first audio signal to be generated by the first MIDI sound source and a second playing information of the second audio signal to be generated by the second MIDI sound source, control means for allowing the first MIDI sound source means to output the first audio signal in accordance with the first phoneme information and the first playing information, and for allowing the second MIDI sound source to output the second audio signal in accordance with the second phoneme information and the second playing information, transducer means for transforming a singing voice of a user to an electric voice signal, mixing means for mixing the first and second audio signals with the electric voice signal and outputting a mixed audio signal, and sound output means for outputting the mixed audio signal as a sound.

In accordance with this invention thus constructed, not only a musical accompaniment of musical instruments but also the back chorus can be reproduced in harmony with a singing voice of the user by using the MIDI sound source. Further, if information relating to a single sound such as "a-" or "u-" is given, the MIDI sound source arbitrarily controls a musical interval, timings of starting and ending of a sound, or sound volume, etc. Therefore it is possible to adapt the chorus to a key (musical interval) or a tempo of a singer. In addition, it is sufficient to store information relating to phoneme of each voice element, not the whole paragraph of the chorus, the memory capacity may be small.

DESCRIPTION OF THE PREFERRED EMBODIMENT

MIDI Standard and MIDI Sound Source

Figure 1A:
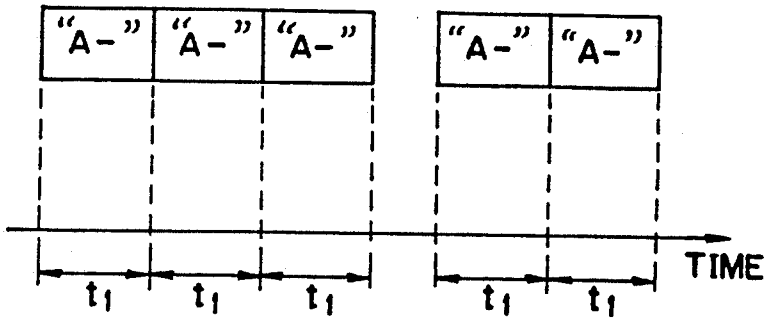
FIG. 1A PRIOR ART
FIGS. 1A & 1B are views showing an example of an operation of a conventional apparatus.
Figure 1B:
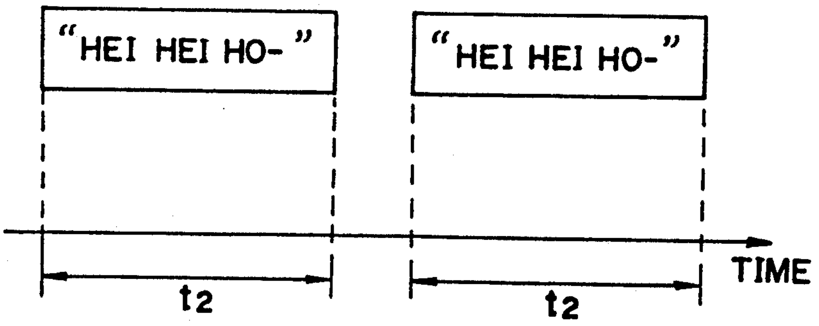
FIG. 1B PRIOR ART

Prior to the description of an embodiment of the present invention, the MIDI standard and the MIDI sound source used in this invention will be described with reference to FIGS. 5 to 9.

The MIDI (Musical Instrument Digital Interface) is the standard for hardware (transmitting/receiving circuit) and software (data format) determined for exchanging information between musical instruments such as synthesizer or electronic piano connected to each other.

Electronic instruments being provided with a hardware based on the MIDI standard and having a function to carry out transmission and reception of a MIDI control signal, serving as a musical instrument control signal, are generally called MIDI equipments.

Subcodes are recorded on disks such as a CD (Compact Disk), a CD-V (Video) or a LVD (Laser Video Disk) including CD format digital sound, or tapes such as a DAT. The subcodes are consisted of P, Q, R, S, T, U, V and W channels. The P and Q channels are used for a purpose of controlling a disk player and display. On the other hand, the R to W channels are empty channels which are generally called as "user's bit". Various studies of application of the "user's bit", such as applications to graphic, sound or image, etc. are being coducted. For instance, the standards of the graphic format have been already proposed.

Further, MIDI format signals may be recorded in the user's bit area. The standards therefor have also been proposed. Using such an application, an audio/video signal reproduced by the disk player may be delivered to an AV system and further to other MIDI equipments so as to carry out audio/visual operation of a program recorded on the disk. Accordingly, various studies of applications to an AV system capable of producing a realism or presence using electronic musical instruments, or to educational software, etc. have been studied.

The MIDI equipments reproduce music in accordance with the musical instrument playing program which is formed by a MIDI signal obtained by converting MIDI format signals sequentially delivered from the disk player to serial signals. A MIDI control signal delivered to the MIDI equipment is serial data having a transfer rate of 31.25 [Kbit/sec] and data, as one byte data, comprised of 8 bits data, a start bit data and a stop bit data. Further, at least one status byte for designating kinds of transferred data and the MIDI channels, and one or two data bytes introduced by that status are combined to form a message serving as musical information. Accordingly, one message is comprised of 1 to 3 bytes, and a transfer time of 320 to 960 [$\mu$ sec] is required for transferring one message. A musical instrument playing program is constructed with a series of the messages.

The configuration of a note on message which is one of channel voice messages and a program change message are shown in FIG. 5 as an example. The note on message of the status byte is a command corresponding to, e.g., an operation of depressing a key of a key board. The note on message is used in pair with a note off message which corresponds to an operation of releasing a key of the keyboard. The relationship between the note on message and the note off message is shown in FIG. 6.

Figure 5A:
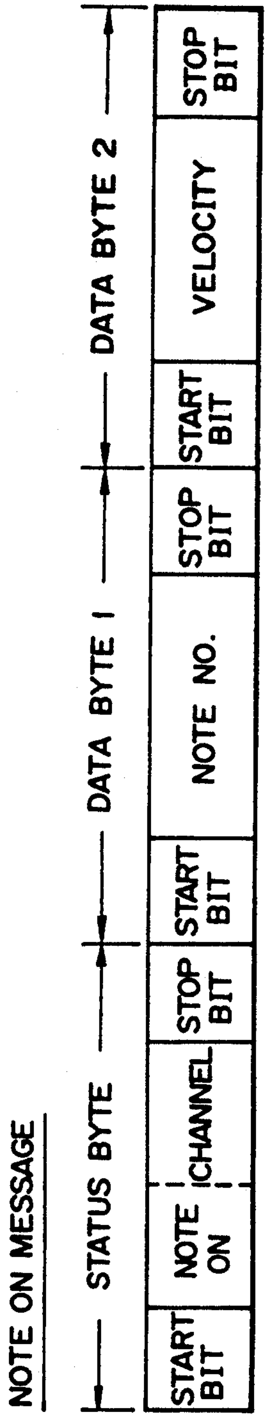
FIG. 5 is a view showing the configuration of note on and program change messages of the MIDI standard.
Figures 6, 7:
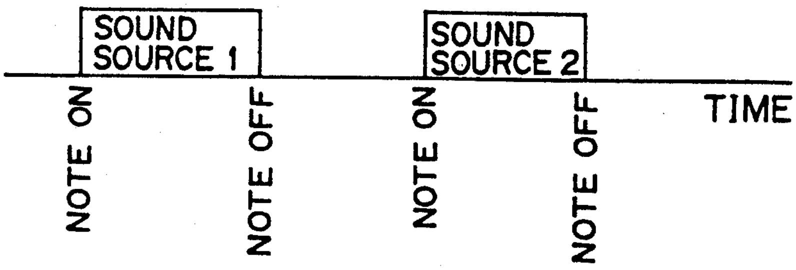
FIG. 6 is a view showing a note on message and a note off message of the MIDI standard.
FIG. 7 is a view showing an actual example of a note on message of the MIDI standard.

Further, an actual example of the note on message is shown in FIG. 7. In this case, the note on message for generating a sound is expressed as 9 nh (h:hexadecimal digit). The note off message is expressed as 8 nh. As the number n indicates the number of channels of 0 to Fh, accordingly 16 kinds of MIDI equipments corresponding to 0 to Fh (0 to 15) can be set. In FIG. 5(A), the note number in the data byte 1 designates any one of the 88 key of piano which is assigned to 128 stages in a manner that the center key of 88 key piano corresponds to the center of the 128 stages. The velocity in the data byte 2 is generally utilized for providing a difference of sound intensity. Responding to the note on message, the MIDI equipment generates a designated sound at a designated intensity (velocity). The velocity is also consisted of 128 stages. For example, designation of the velocity is made as a message of "906460". Further, responding to the note off message, the MIDI equipment carries out the operation of releasing the key of the keyboard.

Figure 5B:
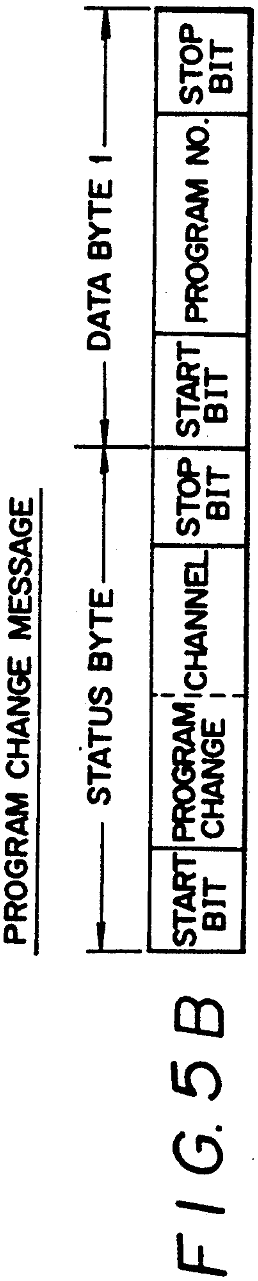
Figure 8:
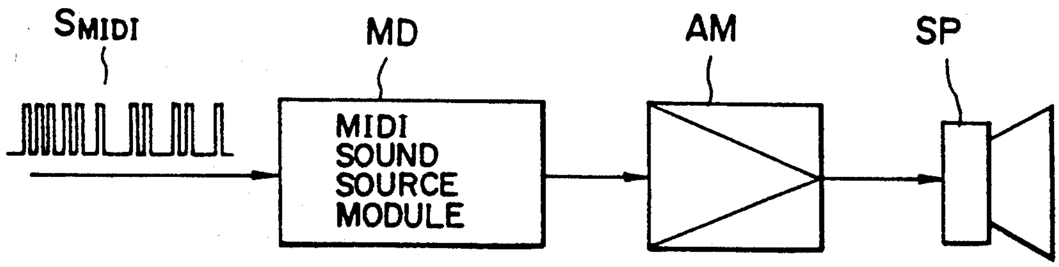
FIG. 8 is a block diagram showing a configuration utilizing a MIDI sound source.

Further, the program change message is a command for changing a tone color or patch, etc. as shown in FIG. 5(B). The status byte is Cn (n is 0 to Fh), and the data byte 1 designates a musical instrument (0 to 7 Fh). Accordingly, in place of the electronic musical instrument, MIDI sound source module MD, amplifier AM and speaker SP are used so as to generate an arbitrary musical sound by the MIDI control signal $S_{MIDI}$, as shown in FIG. 8.

Figure 9:
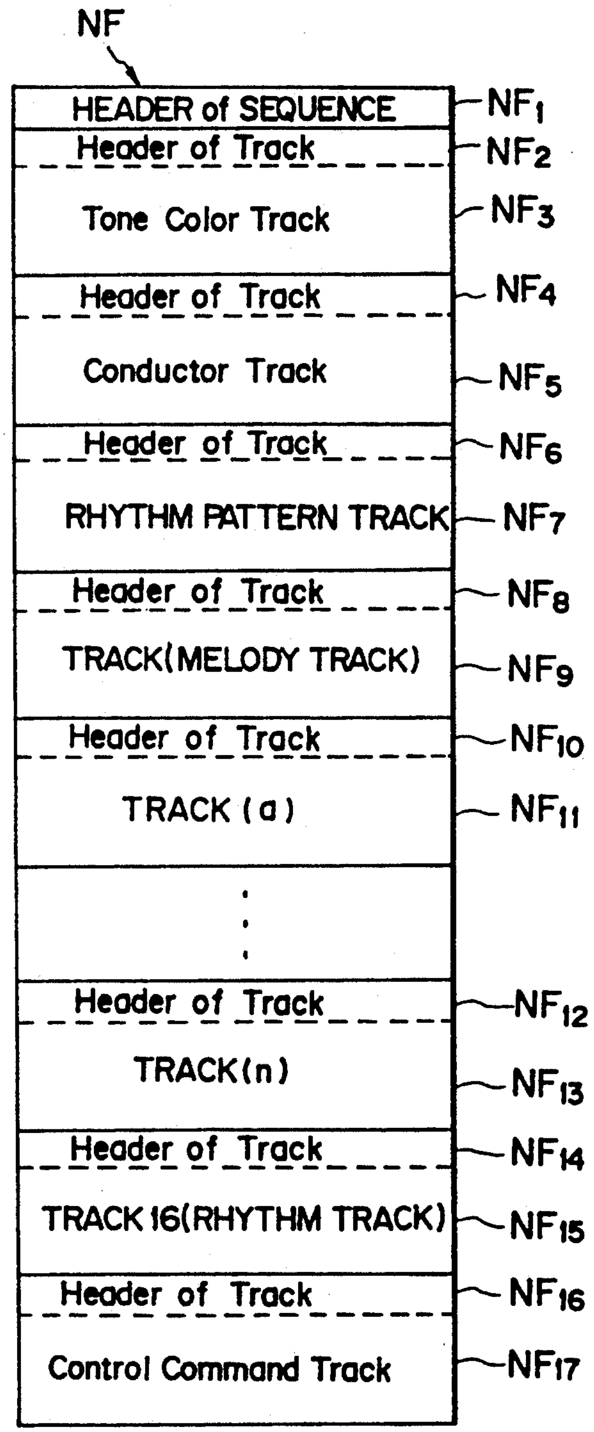
FIG. 9 is a view showing a configuration of a MIDI musical accompaniment file.

The structure of a note file NF, which is a MIDI musical accompaniment playing format stored in a CD (Compact Disk) or an OMD (Optical Memory Disk), etc. as control information of a MIDI sound source for generating a musical accompaniment, is shown in FIG. 9.

The note file NF is a file for storing data to be actually played, which includes data areas of $NF_1$ to $NF_{17}$. Among them, the tone color track $NF_3$ stores data for setting a plurality of tone colors (phonemes) of the MIDI sound source. A conductor track $NF_5$ stores data for setting rhythm and tempo, such as a data of tempo change, etc. The rhythm pattern track $NF_7$ stores pattern data of one measure or bar relating to rhythm. The tracks $NF_8$ to $NF_{15}$ are called as "a note track", and 16 tracks can be used at the maximum. A playing data of MIDI sound source is stored therein. The track $NF_9$ is a track used exclusively for melody. The track $NF_{15}$ is a track used exclusively for rhythm. The track numbers a to n correspond to numbers of 2 to 15. In addition, various control commands for illumination control or LD player control, etc. are stored in the control track $NF_{17}$.

Embodiment

A preferred embodiment of this invention will now be described with reference to the attached drawings.

Figure 2:
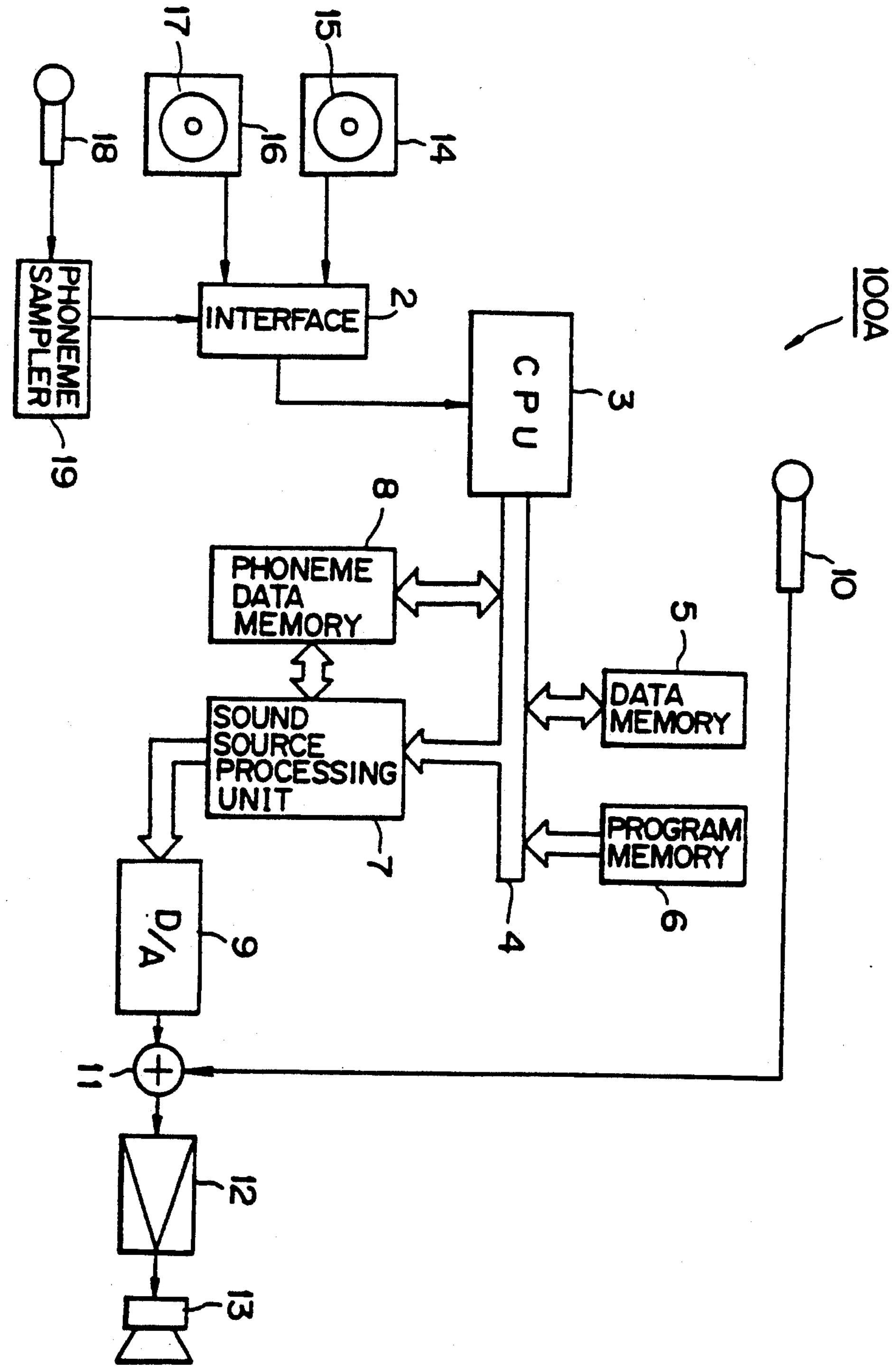
FIG. 2 is a block diagram showing a configuration of an embodiment of this invention.

A musical accompaniment playing apparatus 100A according to the present invention is shown in FIG. 2.

This musical accompaniment playing apparatus 100A comprises a CPU 3, a bus 4, a musical accompaniment disk player 14 connected through an interface 2 to the CPU 3, a phoneme disk player 16 connected through the interface 2 to the CPU 3, a data memory 5, a program memory 6, a sound source processing unit 7, a phoneme data memory 8, a D/A converter 9, a microphone 10, a mixer 11, an amplifier 12, and a speaker 13.

A phoneme disk 17 is loaded in the phoneme disk player 16. In the phoneme disk 17, individual phoneme (voice element) information for back choruses such as "a-", "u-" is recorded in advance. This phoneme information is input to the CPU 3 through the interface 2 and then stored into the phoneme data memory 8 through the bus 4. The phoneme data memory 8 is a memory such as a writable EEPROM, or a RAM. Such phoneme information for back choruses may be recorded in advance into the phoneme data memory 8 instead of reading out from the phoneme disk 17. The sound source processing unit 7 processes phoneme data sent from the phoneme data memory 8 in accordance with program data of the program memory 6 to convert it to PCM data. The program memory 6 is a memory such as ROM for storing program data of the sound source processing such as a loop processing, a tone parameter processing, a patch parameter processing, and a function parameter processing. The data memory 5 is a memory such as a RAM for storing data of sound source information.

While, in the above mentioned embodiment, phoneme information for musical accompaniment is read out from the disk to be stored into the phoneme data memory 8, phoneme information of musical instruments may be recorded in advance into the phoneme data memory 8. In addition, such phoneme information may be recorded in a musical accompaniment disk 15 together with musical accompaniment information.

After a desired musical accompaniment disk 15 is loaded in the musical accompaniment disk player 14, MIDI control information, as shown in FIG. 9, for generating a musical accompaniment and a back chorus is read out therefrom, and is then input to the CPU 3 through the interface 2. The CPU 3 controls the sound source processing unit 7 according to the MIDI control information. That is, according to the MIDI control information, phoneme data stored in the phoneme data memory 8 is read out, and start/stop timings of sound generation, musical interval, or sound intensity are set. Then, the data thus set is processed to be a digital audio signal and transferred to the D/A converter 9 as a digital audio signal of a musical accompaniment and a back chorus. The D/A converter 9 converts the transferred digital audio signal to an analog audio signal and outputs it to the mixer 11.

The microphone 10 receives a singing voice of a singer and outputs an analog voice signal to the mixer 11. The mixer 11 mixes the analog voice signals with the analog audio signal and outputs a mixed audio signal to the amplifier 12. The amplifier 12 amplifies the gain of the mixed audio signal and outputs it to the speaker 13. The speaker 13 outputs this mixed audio signal as a sound. Since a musical accompaniment and a back chorus are reproduced together, the D/A converter 9 is required a function of simultaneously converting a plurality of signals.

Further, in place of using phoneme (voice element) data stored in the phoneme disk 17, since this musical accompaniment playing apparatus includes a microphone 18 and a phoneme sampler 19 as shown in FIG. 2, these external inputting devices may be used to sample a sound of an actual musical instrument or human voice to convert it to phoneme information such as PCM code to be stored into the phoneme data memory 8. The phoneme disk 17 may be an FD (Floppy Disk), an IC card, or a ROM card, etc.. Further, a playing information may be stored in advance in the data memory 5 as a playing information.

Figure 3:
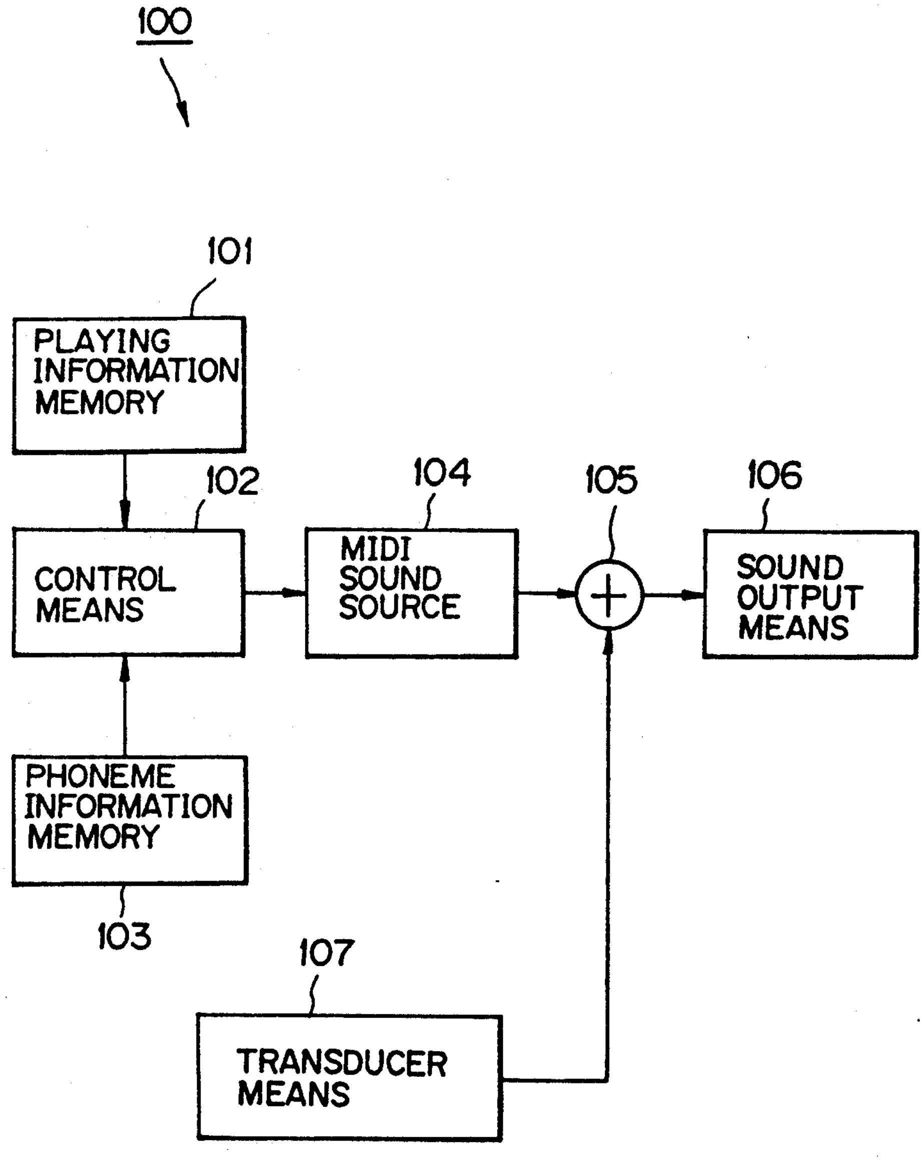
FIG. 3 is a view showing a principle of this invention.

With reference to FIG. 3 which shows the principle of this embodiment, the musical accompaniment playing disk or the data memory 5 corresponds to a playing information memory 101, and the phoneme disk 17 or the phoneme data memory 8 corresponds to a phoneme information memory 103. The CPU 3 corresponds to a control means 102. The sound source processing unit 7, the phoneme data memory 8, and the D/A converter 9 constitute a MIDI sound source 104. It is to be noted that if the phoneme data in the phoneme data memory 8 is not in conformity with the MIDI standard, a data converter is required. The microphone 10 corresponds to a transducer means 107, and the mixer 11 corresponds to a mixing means 105. In addition, the amplifier 12 and the speaker 13 constitute a sound output means 106.

Figure 4:
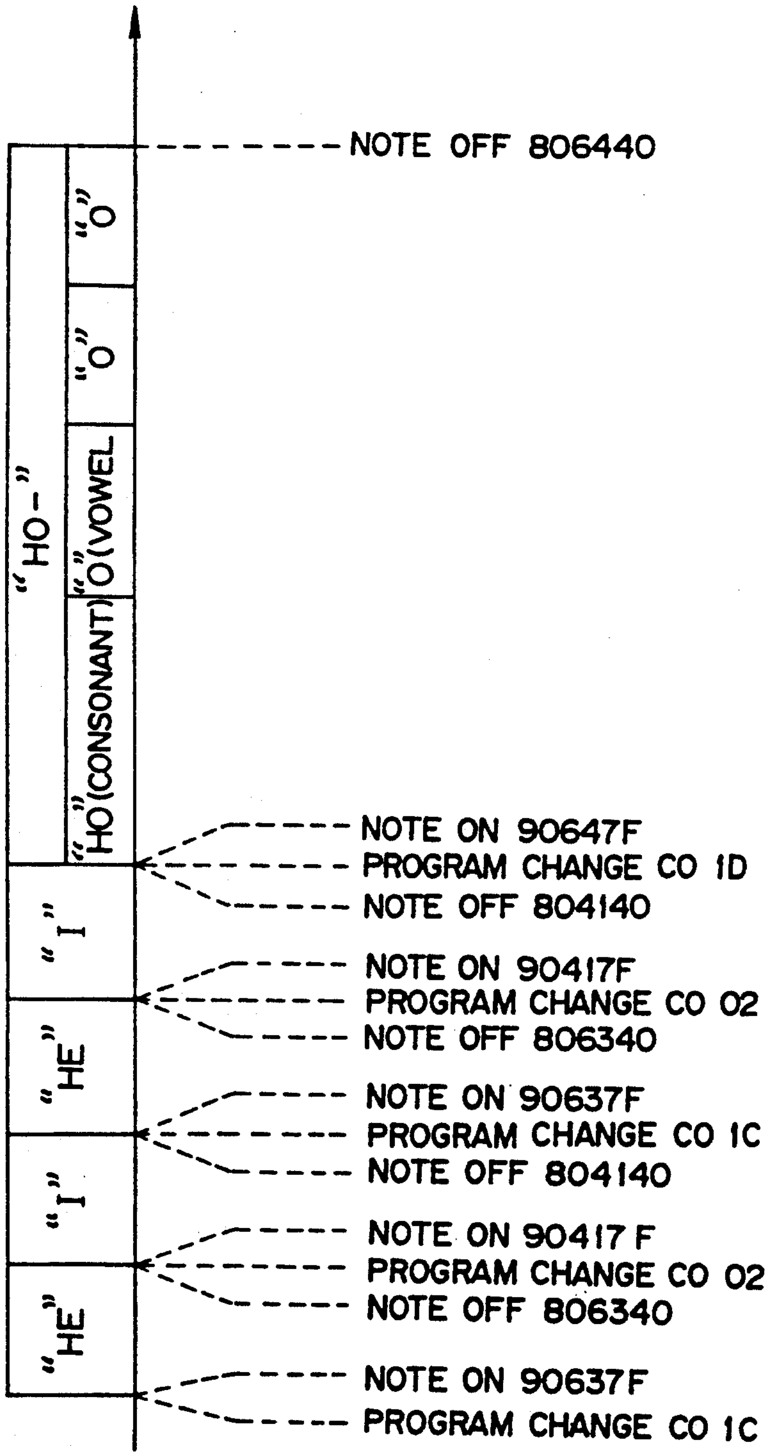
FIG. 4 is a view showing an operation of the embodiment of this invention.

FIG. 4 is a view showing the operation of this embodiment.

Respective phonemes "he", "i" and "ho" are stored in advance in the phoneme data memory 8 according to the MIDI standards. In the case of generating a back chorus of "hei hei ho-", respective phonemes "he", "i", "he", "i", "ho" are controlled by the program change message, the note on message, and the note off message. In this case, the musical interval and the sound volume are controlled at the same time. Further, elongation of a sound like "ho-" (long-held tone) is realized by repeating a vowel "o" included in "ho" in a loop processing manner. In other words, the selection of respective phonemes "he", "i", "ho" to generate a back chorus is made in the same manner as the selection of individual musical instruments. For example, generation of the long-held chorus sound is performed in the same manner as a generation of a long-held piano sound produced by continuously depressing a certain key of a piano. If the singer changes a key or tempo of a musical accompaniment, the note number, or the time period of note on or note off are integratedly varied to follow the change. Accordingly, a key change or a time adjustment become possible. Thus, the back chorus can be reproduced to follow the changes in the key or tempo of a musical accompaniment.

In FIG. 4, the program indicates a tone color. The program No. 1C, 02, etc. are designated in accordance with a tone color of specific MIDI equipments. In the present invention, the program indicates a phoneme, and the designation of the phoneme is made by this program number to read out a desired phoneme from the phoneme data memory 8, thereby allowing the chorus to resemble a human voice.

As described above, in accordance with this invention, since a back chorus is generated from actually recorded, the reproduced back chorus has a natural feeling like a singing voice. Further, the key or tempo of reproduction of individual voice elements can be varied, the chorus is reproduced in harmony with the singing voice of the user, if the key or tempo of a musical accompaniment is changed.

In the above description, an application of the present invention to the chorus voices "HEI HEI HO" in a Japanese popular song "YOSAKU" is cited as an example, however, this invention is applicable to other cases such as the chorus voices "Shalala, wo, woh" in an American popular song YESTERDAY ONCE MORE" as well.

The invention may be embodied in other specific forms without departing from the spirit or essential characteristics thereof. The present embodiment is therefore to be considered in all aspects as illustrative and not restrictive, the scope of the invention being indicated by the appended claims rather than by the foregoing description and all changes which come within the meaning and range of equivalency of the claims are therefore intended to be embraced therein.

What is claimed is:

1. A musical accompaniment playing apparatus comprising:

a MIDI sound source for generating an audio signal including a musical accompaniment signal and a back chorus signal to be reproduced in harmony with the musical accompaniment signal;

a phoneme information memory for storing phoneme information for setting phonemes of each musical instrument used for a musical accompaniment reproduction and phonemes of a singing voice used for a back chorus reproduction;

a playing information memory for storing playing information of the audio signal generated from the MIDI sound source;

control means for allowing the MIDI sound source to output the audio signal in accordance with the phoneme information and the playing information and phoneme sampling means for receiving a human voice signal and producing a phoneme information from the received voice signal, to be stored in the phoneme information memory.

2. A musical accompaniment playing apparatus according to claim 1, further comprising:

transducer means for transforming a singing voice of a singer to an electric voice signal;

mixing means for mixing the audio signal with the electric voice signal and outputting a mixed audio signal; and sound output means for outputting the mixed audio signal as a sound.

3. A musical accompaniment playing apparatus according to claim 2, wherein said transducer means is a microphone.

4. A musical accompaniment playing apparatus according to claim 1 wherein said control means control reproduction of said phonemes of a singing voice.

5. A musical accompaniment playing apparatus comprising:

a first MIDI sound source for generating a musical accompaniment signal as a first audio signal, in accordance with the MIDI standard;

a second MIDI sound source for generating, in accordance with the MIDI standard, a back chorus signal to be reproduced in harmony with the musical accompaniment as a second audio signal;

a first phoneme information memory for storing first phoneme information for setting phonemes of each musical instrument used for a musical accompaniment reproduction;

a second phoneme information memory for storing second musical information for setting phonemes of voice elements used for a back chorus reproduction;

a playing information memory for storing first playing information of the first audio signal to be generated by the first MIDI sound source and second playing information of the second audio signal to be generated by the second MIDI sound source; and control means for allowing the first MIDI sound source to output the first audio signal in accordance with the first phoneme information and the first playing information, and for allowing the second MIDI sound source to output the second audio signal in accordance with the second phoneme information and the second playing information.

6. A musical accompaniment playing apparatus according to claim 5, further comprising:

transducer means for transforming a singing voice of a user to an electric voice signal;

mixing means for mixing the first and second audio signals with the electric voice signal and outputting a mixed audio signal; and sound output means for outputting the mixed audio signal as a sound.

7. A musical accompaniment playing apparatus according to claim 5, further comprising a phoneme disk player for outputting a phoneme information stored in a phoneme disk, and the output phoneme information is stored in the second phoneme information memory.

8. A musical accompaniment playing apparatus according to claim 5, further comprising phoneme sampling means for receiving a human voice signal and producing a phoneme information, from the received voice signal, to be stored in the second phoneme information memory.

9. A musical accompaniment playing apparatus according to claim 5, wherein said transducer means is a microphone.

* * * * *